(12) United States Patent
Fazzio et al.

(10) Patent No.: US 7,369,013 B2
(45) Date of Patent: May 6, 2008

(54) ACOUSTIC RESONATOR PERFORMANCE ENHANCEMENT USING FILLED RECESSED REGION

(75) Inventors: Ronald S. Fazzio, Loveland, CO (US); Richard C. Ruby, Menlo Park, CA (US)

(73) Assignee: Avago Technologies Wireless IP Pte Ltd, Singapore (SG)

( * ) Notice: Subject to any disclaimer, the term of this patent is extended or adjusted under 35 U.S.C. 154(b) by 33 days.

(21) Appl. No.: 11/100,311

(22) Filed: Apr. 6, 2005

(65) Prior Publication Data
US 2006/0226932 A1   Oct. 12, 2006

(51) Int. Cl.
*H03H 9/15* (2006.01)
*H03H 9/54* (2006.01)

(52) U.S. Cl. .................. 333/187; 310/312; 333/189
(58) Field of Classification Search .............. 333/187, 333/189; 310/312
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirer et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,355,408 A | 10/1982 | Scarrott |
| 4,456,850 A | 6/1984 | Inoue et al. |
| 4,529,904 A | 7/1985 | Hattersley |
| 4,625,138 A | 11/1986 | Ballato |
| 4,719,383 A | 1/1988 | Wang et al. |
| 4,798,990 A | 1/1989 | Henoch |
| 4,836,882 A | 6/1989 | Ballato |
| 4,841,429 A | 6/1989 | McClanahan et al. |
| 4,906,840 A | 3/1990 | Zdeblick et al. |
| 5,048,036 A | 9/1991 | Scifres et al. |

(Continued)

FOREIGN PATENT DOCUMENTS

DE    10160617    6/2003

(Continued)

OTHER PUBLICATIONS

A partial copy of GB Search Report for Application No. GB0522393.8 mailed Jan. 9, 2006 (4 pgs.).

(Continued)

*Primary Examiner*—Barbara Summons (57) ABSTRACT

An acoustic resonator that includes a substrate, a first electrode, a layer of piezoelectric material, a second electrode, and a fill region. The first electrode is adjacent the substrate, and the first electrode has an outer perimeter. The piezoelectric layer is adjacent the first electrode. The second electrode is adjacent the piezoelectric layer and the second electrode has an outer perimeter. The fill region is in one of the first and second electrodes.

22 Claims, 8 Drawing Sheets

U.S. PATENT DOCUMENTS

| | | |
|---|---|---|
| 5,048,038 A | 9/1991 | Brennan et al. |
| 5,118,982 A | 6/1992 | Inoue et al. |
| 5,129,132 A | 7/1992 | Zdeblick et al. |
| 5,162,691 A | 11/1992 | Mariani et al. |
| 5,241,209 A | 8/1993 | Sasaki |
| 5,241,456 A | 8/1993 | Marcinkiewicz et al. |
| 5,294,898 A | 3/1994 | Dworsky et al. |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,587,620 A | 12/1996 | Ruby et al. |
| 5,589,858 A | 12/1996 | Kadowaki et al. |
| 5,594,705 A | 1/1997 | Connor et al. |
| 5,671,242 A | 9/1997 | Takiguchi et al. |
| 5,692,279 A | 12/1997 | Mang et al. |
| 5,714,917 A | 2/1998 | Ella |
| 5,853,601 A | 12/1998 | Krishaswamy et al. |
| 5,864,261 A | 1/1999 | Weber |
| 5,872,493 A | 2/1999 | Ella |
| 5,873,153 A | 2/1999 | Ruby et al. |
| 5,873,154 A | 2/1999 | Ylilammi et al. |
| 5,910,756 A | 6/1999 | Ella |
| 5,936,150 A | 8/1999 | Kobrin et al. |
| 5,953,479 A | 9/1999 | Zhou et al. |
| 5,982,297 A | 11/1999 | Welle |
| 6,040,962 A | 3/2000 | Kanazawa |
| 6,060,818 A | 5/2000 | Ruby et al. |
| 6,087,198 A | 7/2000 | Panasik |
| 6,107,721 A | 8/2000 | Lakin |
| 6,111,480 A | 8/2000 | Iyama et al. |
| 6,124,756 A | 9/2000 | Yaklin et al. |
| 6,150,703 A | 11/2000 | Cushman et al. |
| 6,187,513 B1 | 2/2001 | Katakura |
| 6,215,375 B1 | 4/2001 | Larson, III et al. |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,265,246 B1 | 7/2001 | Ruby et al. |
| 6,278,342 B1 | 8/2001 | Ella |
| 6,292,336 B1 | 9/2001 | Horng |
| 3,607,761 A1 | 10/2001 | Nakagawa |
| 6,307,447 B1 | 10/2001 | Barber et al. |
| 6,376,280 B1 | 4/2002 | Ruby et al. |
| 6,377,137 B1 | 4/2002 | Ruby |
| 6,384,697 B1 | 5/2002 | Ruby |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,462,631 B2 | 10/2002 | Bradley et al. |
| 6,466,105 B1 | 10/2002 | Lobl et al. |
| 6,466,418 B1 | 10/2002 | Horng |
| 6,469,597 B2 | 10/2002 | Ruby et al. |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,507,983 B1 | 1/2003 | Ruby et al. |
| 6,515,558 B1 | 2/2003 | Ylilammi |
| 6,518,860 B2 | 2/2003 | Ellä et al. |
| 6,525,996 B1 | 2/2003 | Miyazawa |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panasik |
| 6,550,664 B2 | 4/2003 | Bradley et al. |
| 6,564,448 B1 | 5/2003 | Oura et al. |
| 6,566,979 B2 | 5/2003 | Larson, III et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,600,390 B2 | 7/2003 | Frank |
| 6,601,276 B2 | 8/2003 | Barber |
| 6,617,249 B2 | 9/2003 | Ruby et al. |
| 6,617,750 B2 | 9/2003 | Dummermuth et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson, III et al. |
| 6,657,363 B1 | 12/2003 | Aigner |
| 6,668,618 B2 | 12/2003 | Larson, III et al. |
| 6,670,866 B2 | 12/2003 | Ella et al. |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Piazza et al. |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 1,097,116 A1 | 10/2004 | Larson, III et al. |
| 6,803,835 B2 | 10/2004 | Frank |
| 6,812,619 B1 | 11/2004 | Kaitila et al. |
| 6,828,713 B2 | 12/2004 | Bradley et al. |
| 6,842,088 B2 * | 1/2005 | Yamada et al. ............ 333/187 |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,928 B2 | 8/2005 | Hedler et al. |
| 6,936,954 B2 | 8/2005 | Peczalski |
| 6,946,928 B2 | 9/2005 | Larson, III et al. |
| 6,954,121 B2 | 10/2005 | Bradley et al. |
| 6,963,257 B2 | 11/2005 | Ella et al. |
| 6,975,183 B2 | 12/2005 | Aigner et al. |
| 6,977,563 B2 | 12/2005 | Komuro et al. |
| 6,985,052 B2 | 1/2006 | Tikka |
| 6,987,433 B2 | 1/2006 | Larson, III et al. |
| 6,989,723 B2 | 1/2006 | Komuro et al. |
| 6,998,940 B2 | 2/2006 | Metzger |
| 7,019,604 B2 | 3/2006 | Gotoh et al. |
| 7,019,605 B2 | 3/2006 | Larson, III |
| 7,057,476 B2 | 6/2006 | Hwu |
| 7,084,553 B2 | 8/2006 | Ludwiczak |
| 7,091,649 B2 | 8/2006 | Larson |
| 7,098,758 B2 | 8/2006 | Wang et al. |
| 7,170,215 B2 | 1/2007 | Namba et al. |
| 7,173,504 B2 | 2/2007 | Larson |
| 7,187,254 B2 | 3/2007 | Su et al. |
| 7,230,509 B2 | 6/2007 | Stoemmer |
| 2002/0000646 A1 | 1/2002 | Gooch et al. |
| 2002/0030424 A1 | 3/2002 | Iwata |

| | | | | | | |
|---|---|---|---|---|---|---|
| 2002/0121944 | A1 | 9/2002 | Larson, III et al. | EP | 1 517 443 | 3/2005 |
| 2002/0121945 | A1 | 9/2002 | Ruby et al. | EP | 1517444 | 3/2005 |
| 2002/0152803 | A1 | 10/2002 | Larson, III et al. | EP | 1557945 | 7/2005 |
| 2002/0190814 | A1 | 12/2002 | Yamada et al. | EP | 1 575 165 | 9/2005 |
| 2003/0001251 | A1 | 1/2003 | Cheever et al. | GB | 1207974 | 11/1967 |
| 2003/0006502 | A1 | 1/2003 | Karpman | GB | 2411239 | 8/2005 |
| 2003/0087469 | A1 | 5/2003 | Ma | GB | 2418791 | 4/2006 |
| 2003/0102776 | A1 | 6/2003 | Takeda et al. | JP | 2002/217676 | 8/2002 |
| 2003/0111439 | A1 | 6/2003 | Fetter et al. | WO | WO 98/16957 | 4/1998 |
| 2003/0128081 | A1 | 7/2003 | Ella et al. | WO | WO 01/06647 | 1/2001 |
| 2003/0132493 | A1 | 7/2003 | Kang et al. | WO | WO 01/99276 A1 | 12/2001 |
| 2003/0141946 | A1 | 7/2003 | Ruby et al. | WO | WO 02/103900 | 12/2002 |
| 2003/0179053 | A1 | 9/2003 | Aigner et al. | WO | WO 03/030358 | 4/2003 |
| 2004/0092234 | A1 | 5/2004 | Pohkonen | WO | WO 03/043188 | 5/2003 |
| 2004/0124952 | A1 | 7/2004 | Tikka | WO | WO 03/050950 | 6/2003 |
| 2004/0150293 | A1 | 8/2004 | Uterberger | WO | WO 2003/058809 | 7/2003 |
| 2004/0150296 | A1 | 8/2004 | Park et al. | WO | WO 2004/034579 | 4/2004 |
| 2004/0195937 | A1 | 10/2004 | Shogo et al. | WO | WO 2004/051744 | 6/2004 |
| 2004/0257172 | A1 | 12/2004 | Schmidhammer et al. | WO | WO 2005/043752 | 5/2005 |
| 2004/0263287 | A1 | 12/2004 | Ginsburg et al. | WO | WO 2005/043753 | 5/2005 |
| 2005/0012570 | A1 | 1/2005 | Korden et al. | WO | WO 2005/043756 | 5/2005 |
| 2005/0023931 | A1 | 2/2005 | Bouche et al. | | | |
| 2005/0030126 | A1 | 2/2005 | Inoue et al. | | | |
| 2005/0036604 | A1 | 2/2005 | Scott et al. | | | |
| 2005/0057117 | A1 | 3/2005 | Hiroshi et al. | | | |
| 2005/0057324 | A1 | 3/2005 | Onishi et al. | | | |
| 2005/0068124 | A1 | 3/2005 | Stoemmer | | | |
| 2005/0093396 | A1 | 5/2005 | Larson et al. | | | |
| 2005/0093653 | A1 | 5/2005 | Larson, III | | | |
| 2005/0093654 | A1 | 5/2005 | Larson et al. | | | |
| 2005/0093655 | A1 | 5/2005 | Larson et al. | | | |
| 2005/0093657 | A1 | 5/2005 | Larson et al. | | | |
| 2005/0093658 | A1 | 5/2005 | Larson et al. | | | |
| 2005/0093659 | A1 | 5/2005 | Larson et al. | | | |
| 2005/0104690 | A1 | 5/2005 | Larson | | | |
| 2005/0110598 | A1 | 5/2005 | Larson, III | | | |
| 2005/0128030 | A1 | 6/2005 | Larson et al. | | | |
| 2005/0140466 | A1 | 6/2005 | Larson, III et al. | | | |
| 2005/0167795 | A1 | 8/2005 | Higashi | | | |
| 2005/0193507 | A1 | 9/2005 | Ludwiczak | | | |
| 2005/0203271 | A1 | 9/2005 | Higuchi et al. | | | |
| 2005/0218488 | A1 | 10/2005 | Matsuo | | | |
| 2006/0087199 | A1 | 4/2006 | Larson et al. | | | |
| 2006/0103492 | A1* | 5/2006 | Feng et al. ........ 333/187 | | | |
| 2006/0132262 | A1* | 6/2006 | Fazzio et al. ....... 333/187 | | | |
| 2006/0164183 | A1 | 7/2006 | Tikka | | | |
| 2006/0185139 | A1 | 8/2006 | Larson, III et al. | | | |
| 2007/0084964 | A1 | 4/2007 | John et al. | | | |
| 2007/0085447 | A1 | 4/2007 | Larson | | | |
| 2007/0085631 | A1 | 4/2007 | Larson et al. | | | |
| 2007/0085632 | A1 | 4/2007 | Larson et al. | | | |
| 2007/0086080 | A1 | 4/2007 | Larson et al. | | | |
| 2007/0086274 | A1 | 4/2007 | Nishimura et al. | | | |
| 2007/0090892 | A1 | 4/2007 | Larson | | | |
| 2007/0170815 | A1 | 7/2007 | Unkrich | | | |
| 2007/0171002 | A1 | 7/2007 | Unkrich | | | |

FOREIGN PATENT DOCUMENTS

| | | |
|---|---|---|
| EP | 0865157 | 9/1998 |
| EP | 0880227 | 11/1998 |
| EP | 0973256 | 1/2000 |
| EP | 1047189 | 10/2000 |
| EP | 1100196 | 11/2000 |
| EP | 1 096 259 | 5/2001 |
| EP | 1 180 494 | 2/2002 |
| EP | 1249932 | 10/2002 |
| EP | 1 258 990 | 11/2002 |
| EP | 1258989 | 11/2002 |
| EP | 1542362 | 6/2003 |
| EP | 1528674 | 6/2004 |
| EP | 1528675 | 6/2004 |
| EP | 1528677 | 7/2004 |

OTHER PUBLICATIONS

British Application No. 0605222.9 Search Report dated Jul. 11, 2006.
Auld, B.A., "Acoustic Resonators," Acoustic Fields and Waves in Solids, Second Edition, vol. II, pp. 250-259 (1990), Krieger Publishing Co., Malabar, Florida.
Holzlohner, Ronald et al., "Accurate Calculation of Eye Diagrams and Bit Error Rates in Optical Transmission Systems Using Linearization", *Journal of Lightwave Technology*, vol. 20, No. 3., (Mar. 2002), pp. 389-400.
Reinhardt, Alexandre et al., "Design of Coupled Resonator Filters Using Admittance and Scattering Matrices", *2003 IEEE Ultrasonics Symposium*, (May 3, 2003), 1428-1431.
"Examination report corresponding to application No.", GB0605770.7, (Aug. 25, 2006).
"Examination Report corresponding to application No.", GB0605775.6, (Aug. 30, 2006).
"Search report from corresponding application No.", GB0620152.9, (Nov. 15, 2006).
"Search report from corresponding application No.", GB0620655.1, (Nov. 17, 2006).
"Search report from corresponding application No.", GB0620653.6, (Nov. 17, 2006).
"Search Report from corresponding application No.", GB0620657.7, (Nov. 23, 2006).
Coombs, Clyde F., et al., "Electronic Instrument Handbook", *Second Edition, McGraw-Hill, Inc.*, (1995), pp. 5.1 to 5.29.
"A partial copy of GB Search Report for Application No.", GB05255884.3, (Feb. 2, 2006), 4 pgs.
Tiersten, H.F., et al., "An Analysis of Thiskness-Extensional Trapped Energy Resonant Device Structures with Rectangular Electrodes in the Piezoelectric Thin Film on Silicon Configuration", *J. Appl. Phys. 54* (10), (Oct. 1983), 5893-5910.
"Search Report from corresponding application", No. GB0605225.2.
"Search Report for Great Britain Patent Application", No. 0617742.2, (Mar. 29, 2007).
"Search Report in the Great Britain Patent Application", No. 0619698.4, (Nov. 30, 2006).
Ruby, R. et al., "The Effect of Perimeter Geometry on FBAR Resonator Electrical Performance", *Microwave Symposium Digest, 2005 IEEE MTT-S International*, (Jun. 12, 2005), 217-221.
Schuessler, Hans H., "Ceramic Filters and Resonators", *Reprinted from IEEE Trans. Sonics Ultrason.*, vol. SU-21, (Oct. 1974), 257-268.
Fattinger, G. G.,., et al., "Coupled Bulk Accoustic Wave Resonator Filter: Key technology for single-to-balanced RF filters", *0-7803-8331-1/4/W20.00; IEEE MTT-S Digest*, (2004), 927-929.
Choi, Sungjin et al., "Design of Half-Bridge Piezo-Transformer Converters in the AC Adapter Applications", *IEEE 2005*, 244-248.

Li, Yunxiu et al., "AC-DC Converter with Worldwide Range Input Voltage by Series and Parallel Piezoelectric Transformer Connection ", *35th Annual IEEE Transactions on Power Electronics Specialists Conference,* (2004).

Ivensky, Gregory et al., "A Comparison of Piezoelectric Transformer AC/DC Converters with Current Doubler and voltage Doubler Rectifiers", *IEEE Transactions on Power Electronics,* vol. 19, No. 6., (Nov. 2004).

Navas, J. et al., "Miniaturised Battery Charger using Piezoelectric Transformers", *IEEE,* (2001), 492-496.

Jiang, Yimin et al., "A Novel Single-Phase Power Factor Correction Scheme", *IEEE,* (1993), 287-292.

Lakin, K.M. "Coupled Resonator Filters", *2002 IEEE Ultrasonics Symposium,* (Mar. 2, 2002), 901-908.

Lakin, K.M. et al., "High Performance Stacked Crystal Filters for GPS and Wide Bandwidth Applications", *2001 IEEE Ultrasonics Symposium,* (Jan. 1, 2001), 833-838.

Krishnaswamy, S.V. et al., "Film Bulk Acoustic Wave Resonator Technology", (May 29, 1990), 529-536).

Lobl, H.P. et al., "Piezoelectric Materials for BAW Resonators and Filters", *2001 IEEE Ultrasonics Symposium,* (Jan. 1, 2001), 807-811.

Lankin, K.M. "Bulk Accoustic Wave Coupled Resonator Filters", *2002 IEEE International Frequency Control Symposium and PDA Exhibition,* (Jan. 2, 2002), 8-14.

Jung, Jun-Phil et al., "Experimental and Theoretical Investigattion on the Relationship Between AIN Properties and AIN-Based FBAR Characteristics", *2003 IEEE International Frequency Control Symposium and PDA Exhibition Jointly with the 17th European Frequency and Time Forum,* (Sep. 3, 2003), 779-784.

Yang, C.M. et al., "Highly C Axis Oriented AIN Film Using MOCVD for 5GHx Band FBAR Filter", *2003 IEEE Ultrasonic Symposium,* (Oct. 5, 2003), pp. 170-173.

Martin, Steven J., et al., "Development of A Low Dielectric Constant Polymer for the Fabrication of Integrated Circuit Interconnect", *12 Advanced Materials,* (Dec. 23, 2000), 1769-1778

Hadimioglu, B. et al., ""Polymer Films as Acoustic Matching Layers".", *1990 IEEE Ultrasonics Symposium Proceedings, vol. 3 pp.,* Previously submitted as "Polymer Flies as Acoustic Matching Layers, 1990 IEEE Ultrasonic Symposium Proceeding. vol. 4 pp. 1227-1340, Dec. 1990". Considered by Examiner on Mar. 20, 2007, (Dec. 1990), 1337-1340.

"Search Report from corresponding application No.", *GB 0605779. 8,* (Aug. 23, 2006).

"Examination Report from UK for application", *GB 0605971.1,* (Aug. 24, 2006).

\* cited by examiner

ACOUSTIC RESONATOR PERFORMANCE ENHANCEMENT USING FILLED RECESSED REGION

CROSS-REFERENCE TO RELATED APPLICATIONS

This Patent Application is related to Utility patent application Ser. No. 10/021,085, filed on Dec. 22, 2004, entitled "ACOUSTIC RESONATOR PERFORMANCE ENHANCEMENT USING SELECTIVE METAL ETCH," having and is commonly assigned to the same assignee as the present invention.

BACKGROUND

The need to reduce the cost and size of electronic equipment has created a need for smaller single filtering elements. Thin-Film Bulk Acoustic Resonators (FBARs) and Stacked Thin-Film Bulk Wave Acoustic Resonators (SBARs) represent one class of filter elements with potential for meeting these needs. These filters can collectively be referred to as FBARs. An FBAR is an acoustic resonator that uses bulk longitudinal acoustic waves in thin-film piezoelectric (PZ) material. Typically, an FBAR includes a layer of PZ material sandwiched between two metal electrodes. The combination PZ material and electrodes are suspended in air by supporting the combination around its perimeter or are placed over an acoustic mirror.

When an electrical field is created between the two electrodes, the PZ material converts some of the electrical energy into mechanical energy in the form of acoustic waves. The acoustic waves propagate generally in the same direction as the electric field and reflect off the electrode-air or electrode-acoustic mirror interface at some frequency, including at a resonance frequency. At the resonance frequency, the device can be used as an electronic resonator. Multiple FBARs can be combined such that each is an element in RF filters.

Ideally, the resonant energy in the filter elements is entirely "trapped" in the resonator. In practice, however, dispersive modes exist. These modes can result in a decreased quality factor (Q) for the filter.

For these and other reasons, a need exists for the present invention.

SUMMARY

One aspect of the present invention provides an acoustic resonator that includes a substrate, a first electrode, a layer of piezoelectric material, a second electrode, and a fill region. The first electrode is adjacent the substrate, and the first electrode has an outer perimeter. The piezoelectric layer is adjacent the first electrode. The second electrode is adjacent the piezoelectric layer and the second electrode has an outer perimeter. The fill region is in one of the first and second electrodes.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
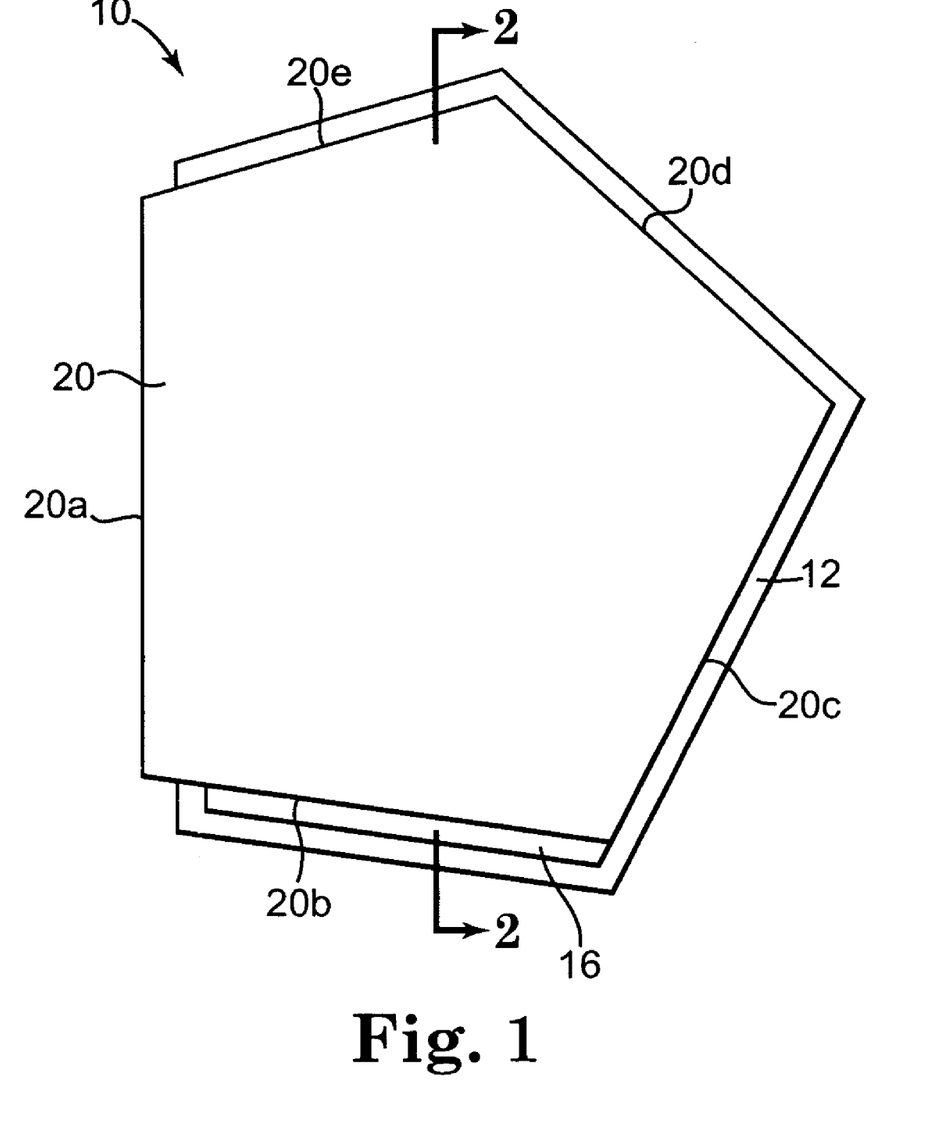
FIG. 1 illustrates a top plan view of an FBAR.
Figure 2:
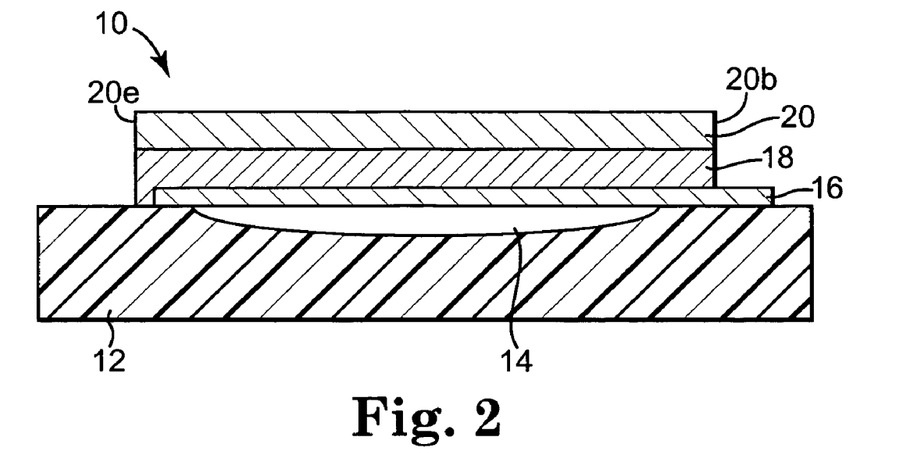
FIG. 2 illustrates a cross-sectional view of an FBAR.

FIGS. 1 and 2 illustrate top and cross-sectional views, respectively, of FBAR 10. FBAR 10 includes substrate 12, depression 14, first electrode 16, piezoelectric (PZ) layer 18, and second electrode 20. In FIG. 1, PZ layer 18 and depression 14 are hidden from view. Second electrode 20 has a perimeter that is illustrated in FIG. 1 as pentagon-shaped, having edges 20a, 20b, 20c, 20d and 20e. Two edges, 20b and 20e, are illustrated in the cross-sectional view of FIG. 2. Typically, contacts (not illustrated) are coupled to first electrode 16 and to second electrode 20 and a passivation layer (not illustrated) may cover top electrode 20. The contacts facilitate connecting the first and second electrodes 16 and 20 to a source of voltage.

First electrode 16, PZ layer 18, and second electrode 20 collectively form an FBAR membrane. The FBAR membrane is adjacent substrate 12 and suspended over depression 14 to provide an electrode-air interface. In one embodiment, depression 14 is created by etching away a portion of substrate 12. Depression 14 is deep enough so that sufficient electrode-air interface is created under the FBAR membrane.

In an alternative embodiment, the FBAR membrane may be placed adjacent an acoustic mirror (not illustrated in FIGS. 1 and 2) formed within substrate 12. In this way, an electrode-acoustic mirror interface is formed. The resonator thus formed is a Solid Mounted Resonator (SMR).

In one embodiment, substrate 12 is made of silicon (Si) and PZ layer 18 is made from aluminum nitride (AlN). Alternatively, other piezoelectric materials may be used for PZ layer 18. In one embodiment, first and second electrode 16 and 20 may be made of molybdenum (Mo). Alternatively, other materials may be used for the electrodes. In one embodiment, the contacts may be made of gold (Au). Alternatively, other materials may be used for the contacts.

FBAR 10 illustrated in FIGS. 1 and 2 is configured to use longitudinal or shear acoustic waves propagating in PZ layer 18. When an electric field is created between first and second electrodes 16 and 20 via an impressed voltage, the piezoelectric material of PZ layer 18 converts some of the electrical energy into mechanical energy in the form of acoustic waves. So configured, FBAR 10 exhibits dispersive modes resulting in a quality factor (Q) loss for FBAR 10.

Figure 3:
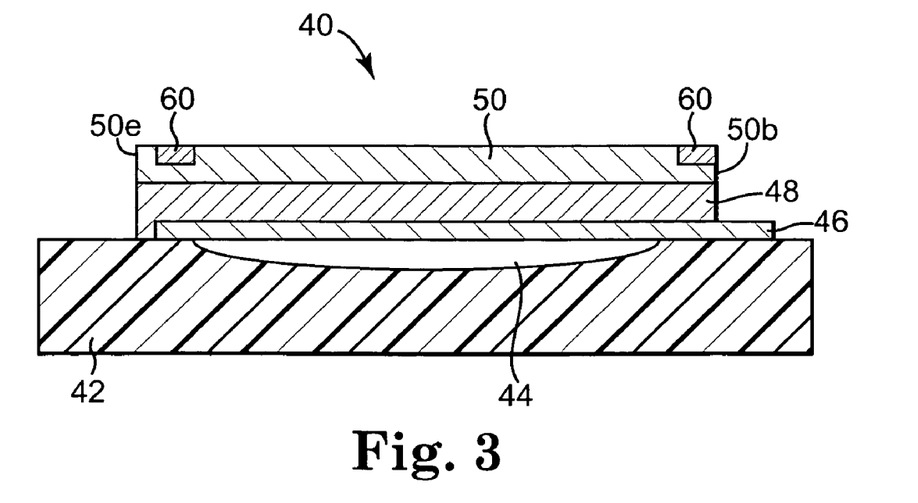
FIG. 3 illustrates a cross-sectional view of an FBAR according to one embodiment of the present invention.

FIG. 3 illustrates a cross-sectional view of FBAR 40 in accordance with one embodiment of the present invention. FBAR 40 includes substrate 42, depression 44, first electrode 46, piezoelectric (PZ) layer 48, second electrode 50 and filled region 60. Typically, contacts (not illustrated in FIG. 3) are coupled to first and second electrodes 46 and electrode 50, and a passivation layer covers the second electrode (also not illustrated in FIG. 3). The contacts facilitate connecting first and second electrodes 46 and 50 to a voltage source. First electrode 46, PZ layer 48, and second electrode 50 collectively form an FBAR membrane, which may be placed over a depression 44 or over an acoustic mirror as discussed above. The FBAR membrane is illustrated adjacent substrate 42 and suspended over depression 44 to provide an electrode-air interface. As with previous embodiments, an electrode-acoustic mirror interface is also obtainable using an SMR design in accordance with the present invention.

Second electrode 50 and the other layers of the FBAR membrane have a perimeter that can be of various configurations. For example, the perimeters of each can be pentagon-shaped, similar to FBAR 10 above. They could also be any of various polygonal shapes, circular, or various irregular shapes. The cross-sectional view illustrated in FIG. 3 illustrates two locations along the perimeter of second electrode 50, edges 50*b* and 50*e*. In one embodiment, an edge of PZ layer 48 is generally aligned with edge 50*b* of second electrode 50 in the vertical direction in FBAR 40 as illustrated in FIG. 3.

In FBAR 40 illustrated in FIG. 3, a filled region 60 has been added into second electrode 50 adjacent the edge 50*b* and near edge 50*e* of second electrode 50. In one embodiment, fill region 60 is located just outside the perimeter of depression 44. In this way, when the perimeter or outside diameter of depression 44 is extended in the vertical direction (as oriented in the illustration of FIG. 3), fill region 60 is just "outside" the perimeter of depression 44.

In other embodiments, fill region 60 overlaps the perimeter of depression 44 such that part of fill region 60 is "inside" and part is "outside" the perimeter of depression 44. In still other embodiments, fill region 60 lies entirely "inside" the perimeter of depression 44.

Fill region 60 improves the performance of FBAR 40, resulting in improved insertion loss and improved resonator quality factor Q of FBAR 40. The overall quality factor Q of FBAR 40 depends proportionally on a parameter of resistance called $R_p$. In FBAR 40, the $R_p$ may be improved by fill region 60.

An electric field is created between first and second electrodes 46 and 50 via an impressed voltage. The piezoelectric material of PZ layer 48 converts some of the electrical energy into mechanical energy in the form of acoustic waves. Some of the acoustic waves in FBAR 40 are longitudinal acoustic waves of any mode type, while others are transverse acoustic waves of the compression, shear, or drum mode type. FBAR 40 is designed to use longitudinal acoustic waves propagating in the thickness extensional direction in the PZ layer 48 as the desired resonator mode. However, FBAR 40, which provides fill region 60, reduces or suppresses energy loss, thereby improving the Q of the filter. In one embodiment, fill region 60 helps trap energy from lateral modes in FBAR 40.

In one embodiment, fill region 60 is filled with a material that is different than that used for second electrode 50. In that case, the material in fill region 60 will have different dispersion characteristics than will the remaining material of second electrode 50, which in one case is Mo. Adding this material with differing dispersion characteristics can improve insertion loss and improve the resonator quality factor Q of FBAR 40. In one embodiment, the material in fill region 60 increases the FBAR membrane's stiffness at its edge. In one case, the material in fill region 60 is such that it increases the acoustic impedance of the fill region 60 relative to that at the center of the FBAR membrane. Such material may be denser than the electrode material. For example, the material in fill region 60 can be W, while second electrode 50 is made of Mo. In other embodiments first and second electrodes 46 and 50 may be metal such as Pt, W, Cu, Al, Au, or Ag. In alternative embodiments, material in fill region 60 could also be made of materials such as polyimide, BCB (benzocyclobutene), $SiO_2$, $Si_3N_4$, or other dielectrics, AlN, ZnO, $LiNbO_3$, PZT, $LiTaO_3$, $Al_{2O3}$, or other piezoelectric materials, Pt, W, Cu, Al, Au, Ag, or other metals or alloys of metals.

In one embodiment, fill region 60 has a depth in second electrode 50 that is on the order of hundreds to thousands of angstroms, and a width on the order of fractions of a micron to microns or even larger, up to that portion of the width of second electrode 50 that extends beyond or outside the perimeter of depression 44. In one embodiment, second electrode 50 is selectively etched to form a recessed feature that is then filled in with material to form fill region 60. In one embodiment, second electrode 50 is constructed using a lift-off technique to form a recessed feature that is filled in with material to form fill region 60.

Figure 4:
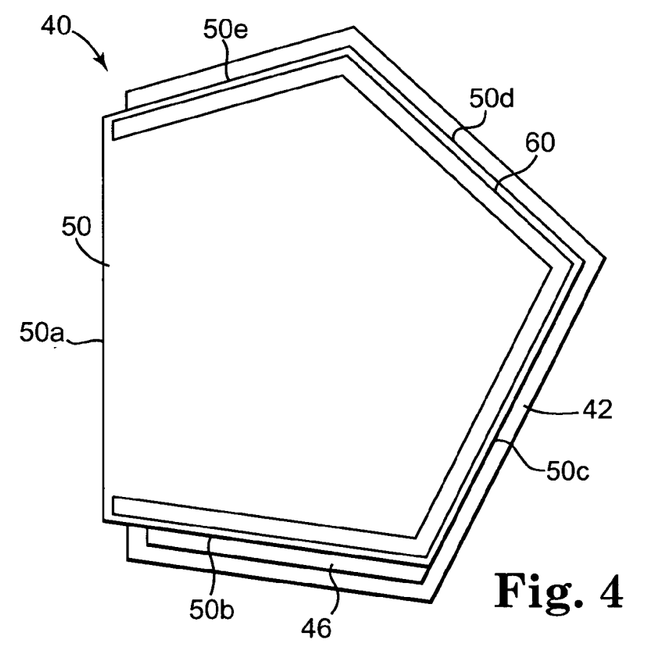
FIG. 4 illustrates a top plan view of one embodiment of the FBAR illustrated in FIG. 3.
Figure 5:
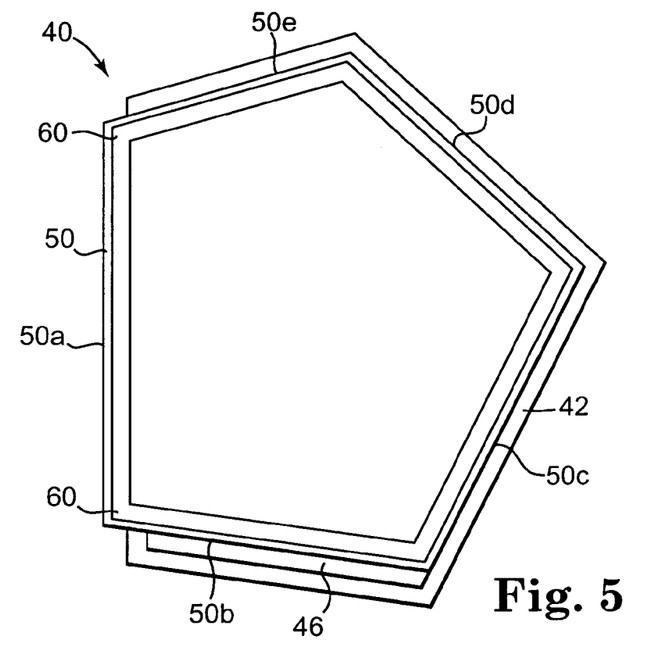
FIG. 5 illustrates a top plan view of an alternative embodiment of the FBAR illustrated in FIG. 3.

FIGS. 4 and 5 illustrate plan views of FBAR 40 of FIG. 3 in accordance with alternative embodiments of the present invention. As illustrated in FIGS. 4 and 5, FBAR 40 includes substrate 42, first electrode 46, and second electrode 50. In FIGS. 4 and 5, piezoelectric (PZ) layer 48 and depression 44 are hidden from view. Typically, contacts (not illustrated in the Figures) are coupled to first and second electrodes 46 and 50, and a passivation layer (also not illustrated in the Figures) covers second electrode 50.

In FIGS. 4 and 5, fill region 60 is illustrated extending adjacent the perimeter of second electrode 50. In the Figures, the perimeter of second electrode 50 is generally pentagon-shaped having five relatively straight edges (50*a*, 50*b*, 50*c*, 50*d*, and 50*e*), but may also be essentially any polygonal shape, circular in shape, or have any other smooth or irregular shape.

In FIG. 5, fill region 60 is illustrated extending adjacent the perimeter of second electrode 50 along all of the five edges of the pentagon-shaped electrode, that is, adjacent edges 50*a*, 50*b*, 50*c*, 50*d*, and 50*e*. FIG. 4 illustrates an alternative embodiment of FBAR 40 where fill region 60 extends adjacent the perimeter of second electrode 50 along four of the five edges of the pentagon-shaped electrode, that is, adjacent edges 50*b*, 50*c*, 50*d*, and 50*e*. In one embodiment, a contact is attached to the fifth edge 50*a* of second electrode 50, so fill region 60 does not extend along that edge in that embodiment.

As one skilled in the art will understand, any number of alternative fill regions 60 may be provided adjacent the edges of second electrode 50 consistent with the present invention. Fill region 60 may be continuously extending along some or all of the edges of second electrode 50 as illustrated, fill regions 60 may have smaller segments that are not continuous along the edge, and other shapes and configurations of fill regions 60 can be used, especially where second electrode 50 is a shape other than a pentagon.

Figure 6:
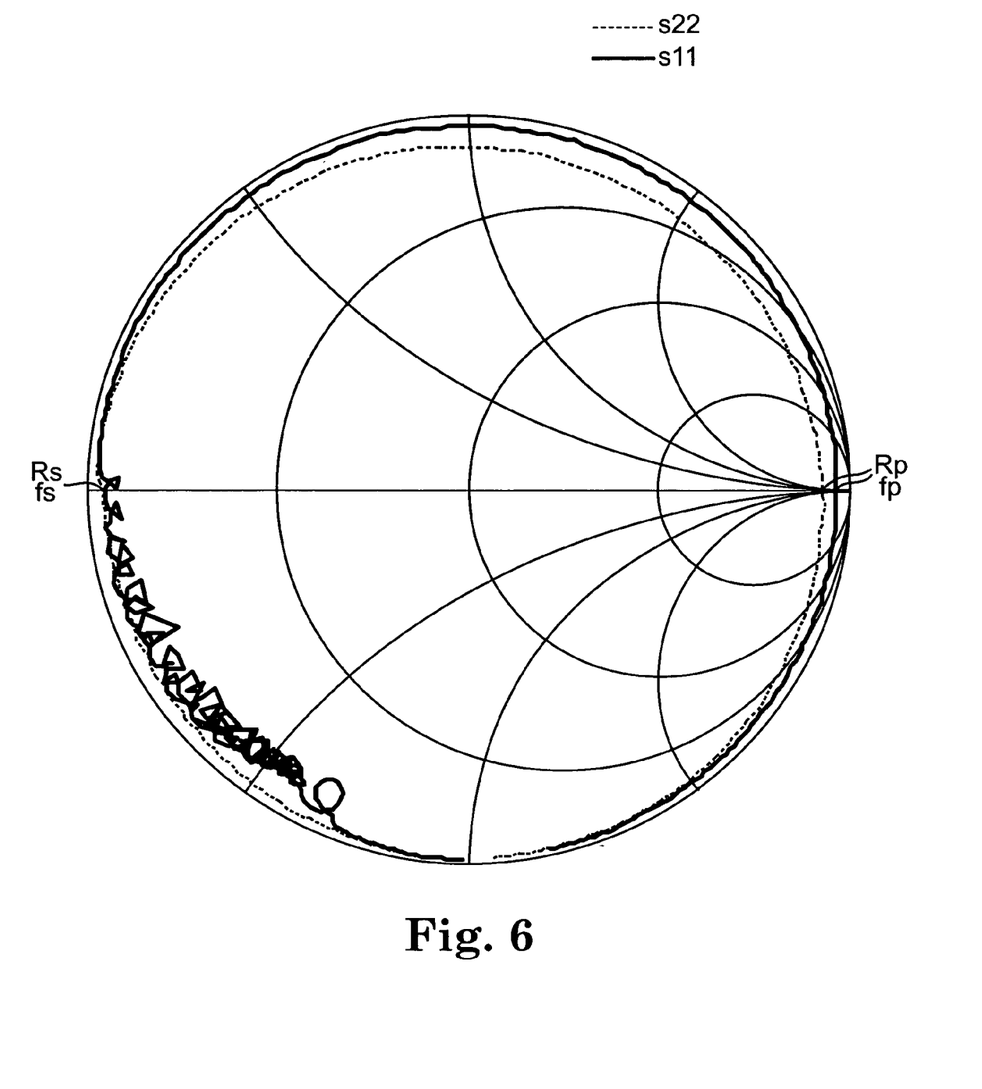
FIG. 6 illustrates Q circles for two exemplary FBARs plotted on a Smith chart.

FIG. 6 illustrates Q circles for two exemplary FBARs plotted on a Smith chart, and illustrates improvement in $R_p$ and therefore Q in one of the FBARs. As is known in the art, a Smith Chart is a polar plot of a complex impedance (used in FIG. 6 to illustrate measures of s11 and s22 scattering parameters). These s11 and s22 scattering parameters represent a ratio of complex amplitudes of backward and forward waves. The Smith Chart aids in translating the reflection coefficients into impedance and it maps part of the impedance placed into a unit circle. The improved performance of FBAR 40 is demonstrated by the Q circles illustrated in FIG. 6. FIG. 6 illustrates the S-parameter measurements of an exemplary filled device, such as FBAR 40 with fill region 60. As illustrated, the filled device of FBAR 40 with fill region 60 (solid line labeled S11) has a much improved $R_p$ versus that of a control device, such as that illustrated in FIG. 2 (dashed line labeled S22) in the upper half of the chart.

Generally, the horizontal axis passing through the unit circle represents real impedance, the area above the axis represents inductive reactance and the area below represents capacitive reactance. The left-hand portion of the chart at zero reactance represents series resonance frequency (fs) and occurs where the Q circle crosses the real axes on the left side of the Smith Chart. The left-hand portion of the chart also demonstrates the parameter of resistance $R_s$. The right-hand portion of the chart at zero reactance represents parallel resonant frequency (fp) and occurs where the Q circle crosses the real axes on the right side of the Smith Chart. The right-hand portion of the chart also demonstrates the parameter of resistance $R_p$. The closer that a plot of FBAR filter characteristics on a Smith Chart is to the perimeter of the Smith Chart, the higher the Q will be for that FBAR. Also, the more smooth that the curve is, the lower the noise is in the FBAR.

In FIG. 6, the performance of FBAR 40 as a filter is illustrated by the solid line Q circle s11 and the performance of a prior art FBAR without a filled region in the electrode is illustrated by the dashed line Q circle s22. As evident, FBAR 40 improves the quality of the filter near the frequency fp. FBAR 40, illustrated by Q circle s11, more closely approximates a unit circle in the upper half of the unit circle and is representative of a less lossy device in that area, which improves the performance of FBAR 40 when used in a filter.

FIG. 6 also illustrates that FBAR 40 used as a filter actually enhances spurious modes below the series resonant frequency fs, as indicated in the lower-left side or "southwest" quadrant of the unit circle. When FBAR 40 is used in applications where the increase in noise in this frequency regime does not impair the device performance, the improvements illustrated in the other areas of the unit circle can be exploited. For example, in some embodiments FBAR 40 is used as a resonator in a filter application that employs a half-ladder topology. The performance of the filter benefits from the improved $R_p$, and any noise introduced by the increased spurious modes lies outside the filter passband.

Figure 7:
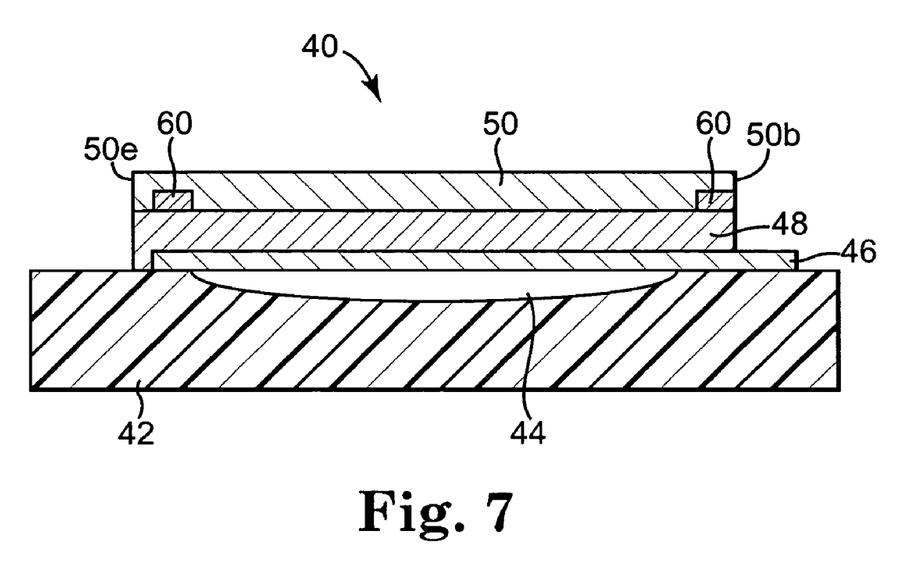
FIG. 7 illustrates a cross-sectional view of an FBAR according to one embodiment of the present invention.

FIG. 7 illustrates a cross-sectional view of FBAR 40 in accordance with an alternative embodiment of the present invention. FBAR 40 is essentially the same as that illustrated in FIG. 3, and includes substrate 42, depression 44, first electrode 46, piezoelectric (PZ) layer 48, second electrode 50 and fill region 60. Two edges, 50b and 50e, of the perimeter of second electrode 50 are also illustrated. In addition, however, FBAR 40 illustrated in FIG. 7, has fill region 60 formed in a surface of second electrode 50 that is opposite the surface in which fill region 60 was formed in FIG. 3. As FBAR 40 is depicted in FIG. 3, fill region 60 is on the "top" surface of second electrode 50, whereas as FBAR 40 is depicted in FIG. 7, fill region 60 is on the "bottom" surface of second electrode 50. In one embodiment, fill region 60 depicted in FIG. 7 is also outside the edge of the perimeter of depression 44. In alternative embodiments fill region 60 overlaps the perimeter of depression 44, and in other embodiments, fill region 60 lies entirely inside the perimeter of depression 44.

In one embodiment, the performance of FBAR 40 as illustrated in FIG. 7 is essentially the same as that described above for FBAR 40 as depicted in FIG. 3. Fill region 60 on the "bottom" surface of second electrode 50 can be achieved in a variety of ways known by those skilled in the art. For example, the structure illustrated in FIG. 7 could be constructed by using a lift-off process (i.e., mask, material deposition, and lift-off) after piezoelectric deposition, followed by deposition of the top electrode material.

Figure 8:
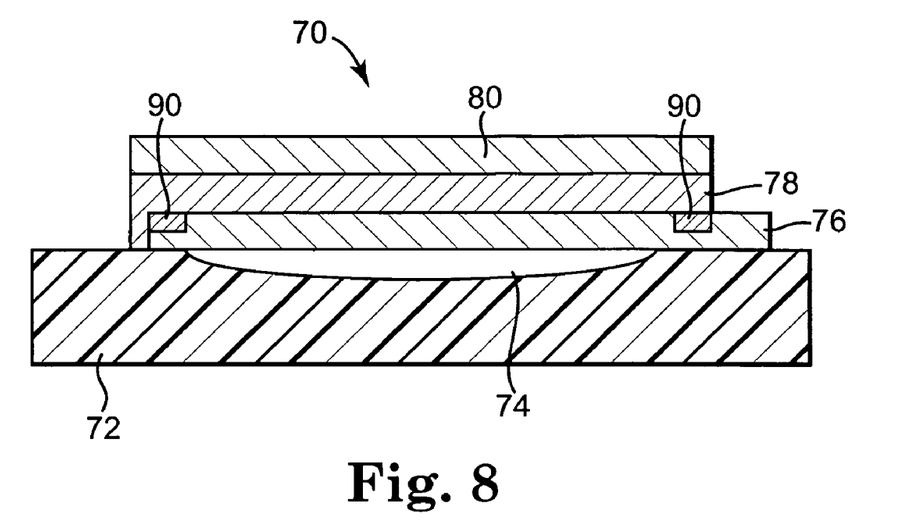
FIG. 8 illustrates a cross-sectional view of an FBAR according to another embodiment of the present invention.
Figure 9:
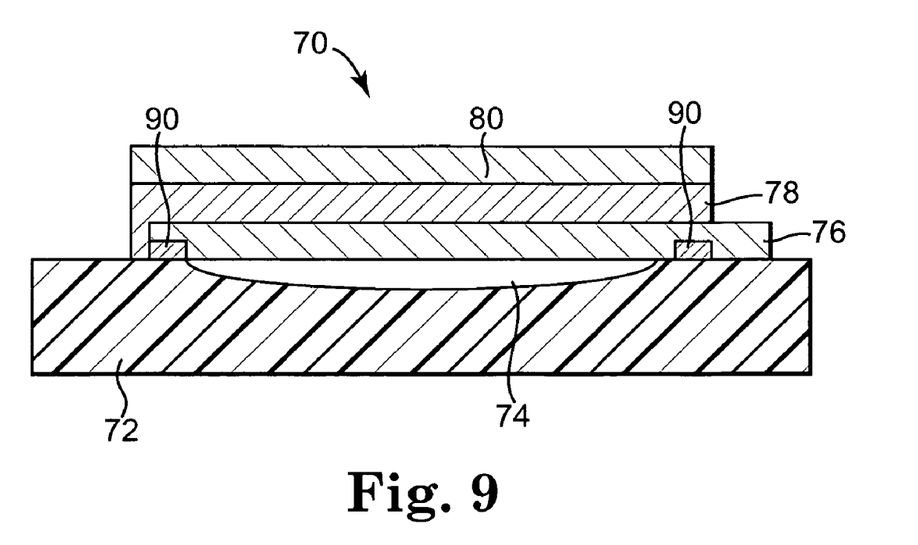
FIG. 9 illustrates a cross-sectional view of an FBAR according to another embodiment of the present invention.

FIGS. 8 and 9 illustrate cross-sectional views of FBAR 70 in accordance with alternative embodiments of the present invention. FBAR 70 includes substrate 72, depression 74, first electrode 76, piezoelectric (PZ) layer 78, second electrode 80, and fill material 90. Typically, contacts (not illustrated in the Figures) are coupled to first and second electrodes 76 and 80. Also, an optional passivation layer (not illustrated in the Figures) may be used to cover second electrode 80. The contacts facilitate connecting first and second electrodes 76 and 80 to a voltage source. First electrode 76, PZ layer 78, and second electrode 80 collectively form an FBAR membrane, which may be placed over a depression 74 or over an acoustic mirror as discussed above. The FBAR membrane is illustrated adjacent substrate 72 and suspended over depression 74 to provide an electrode-air interface. As with previous embodiments, an electrode-acoustic mirror interface is also obtainable using an SMR design in accordance with the present invention.

FBAR 70 is similar to FBAR 30 illustrated in FIG. 3; however, FBAR 70 has fill region 90 inserted in first electrode 76, rather than in the second electrode as above. Fill region 90 inserted in first electrode 76 also improves the performance of FBAR 70, resulting in improved insertion loss and improved resonator quality factor Q of FBAR 70. In FIG. 8, fill region 90 is illustrated adjacent the "top surface" of first electrode 76 and in FIG. 9, fill region 90 is illustrated adjacent the "bottom surface" of first electrode 76. In each case, fill region 90 is illustrated just outside the perimeter of depression 74. In this way, when the perimeter or outside diameter of depression 44 is extended in the vertical direction (as oriented in the illustration of FIGS. 8 and 9), fill region 90 is just "outside" the perimeter of depression 74. In alternative embodiments, fill region 90 overlaps the perimeter of depression 74, and in other embodiments, fill region 90 lies entirely inside the perimeter of depression 74. Like fill region 60 described previously with respect to FBAR 40, fill region 90 improves the performance of FBAR 70, resulting in improved noise reduction and improved resonator quality factor Q of FBAR 70.

As with embodiments above, fill region 90 is filled with a material that is different than that used for second electrode 80. In that case, the material in fill region 90 will have different dispersion characteristics than will the remaining material of second electrode 80, which in one case is Mo. Adding this material with differing dispersion characteristics can improve insertion loss and improve the resonator quality factor Q of FBAR 70. In one embodiment, the material in fill region 90 increases the FBAR membrane's stiffness at its edge. In one case, the material in fill region 90 is such that it increases the acoustic impedance of the fill region 90 relative to that at the center of the FBAR membrane. Such material may be denser than the electrode material. For example, the material in fill region 90 can be W, while second electrode 80 is made of Mo. In other embodiments first and second electrodes 76 and 80 may be metal such as Pt, W, Cu, Al, Au, or Ag. In alternative embodiments, material in fill region 90 could also be made of materials such as polyimide, BCB, $SiO_2$, $Si_3N_4$, or other dielectrics, AlN, ZnO, $LiNbO_3$, PZT, $LiTaO_3$, $Al_2O_3$, or other piezoelectric materials, Pt, W, Cu, Al, Au, Ag, or other metals or alloys of metals.

FBARs 40 and 70 may be fabricated in a variety of ways consistent with the present invention. In one embodiment, for example, a recessed region is created in the top electrode by first depositing electrode metal to a thickness slightly less than the desired thickness. Then a photo mask is used to pattern the center region of the resonator. The remaining thickness of electrode metal is then deposited, and a lift-off process is used to remove the resist remaining in the recessed area. An additional photo mask is then used to pattern the fill region. Fill material is deposited in the fill region, and the mask and fill material outside the fill region are removed in a lift-off process. In another embodiment, the recessed region may be produced by first depositing electrode metal to the desired thickness, patterning the electrode with a photo mask, and etching the recessed region. In another embodiment, the fill material may be produced by first depositing fill material, patterning the fill region with a photo mask, and etching away the fill material outside the fill region.

Figure 10A:
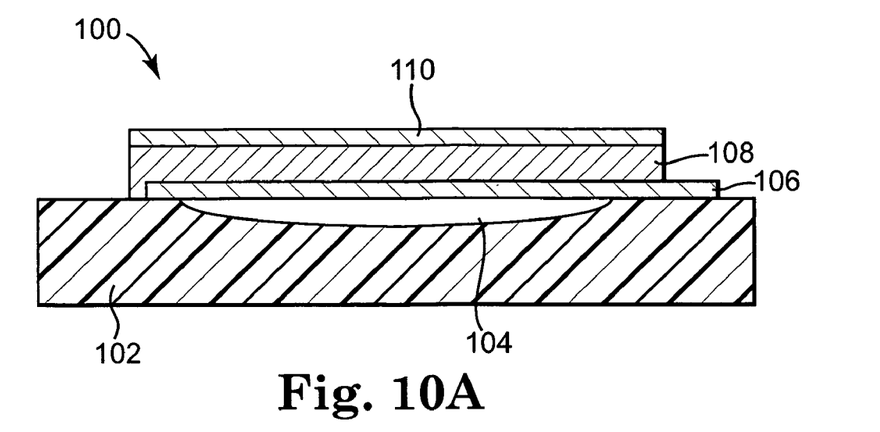
FIGS. 10A-10F are cross-sectional views illustrating various stages of fabrication of an FBAR according to another embodiment of the present invention.

FIGS. 10A-10F are cross-sectional views illustrating various intermediate stages of fabrication of FBAR 100 according to one embodiment of the present invention. FBAR 100 is similar to those illustrated in FIGS. 3-9, and includes substrate 102, depression 104, first electrode 106, piezoelectric (PZ) layer 108, and second electrode 110, which collectively form an FBAR membrane. FIG. 10A illustrates FBAR 100 prior to formation of a fill region 120 (illustrated in FIG. 10F and analogous to above-described fill regions 60 and 90).

Figure 10B:
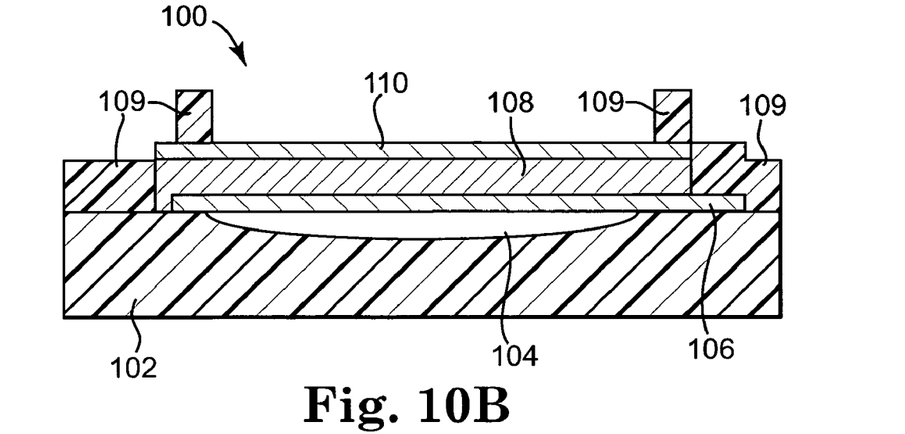
Figure 10C:
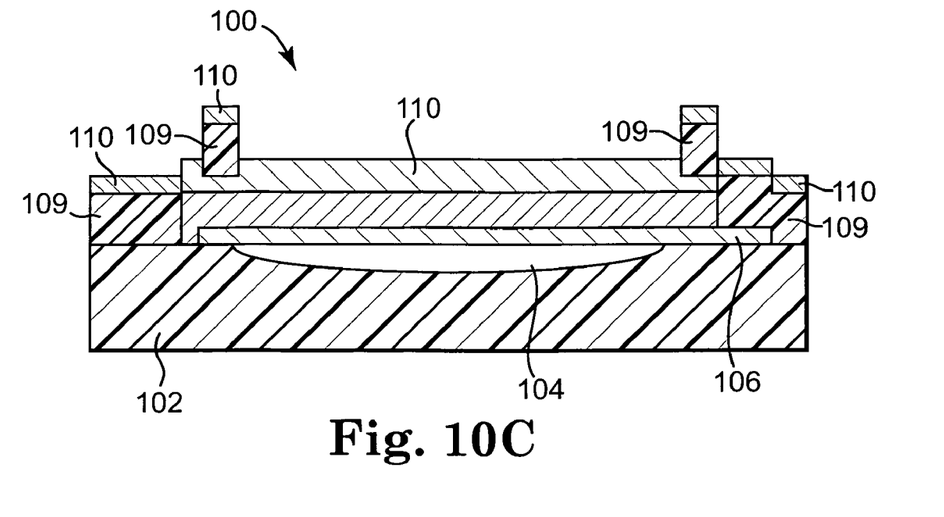
Figure 10D:
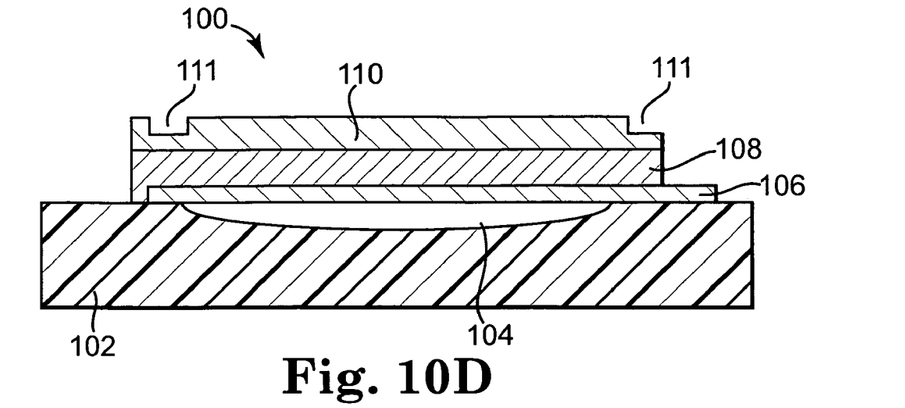

FIG. 10B illustrates FBAR 100 with a photo mask 109 deposited over the FBAR membrane. Photo mask 109 is used to pattern a recessed region using a lift-off process. FIG. 10C illustrates FBAR 100 of FIG. 10B after additional electrode material metal 110 is deposited, but before the lift-off process. FIG. 10D illustrates FBAR 100 after the lift-off process. The lift off process removes photo mask 109 and all metal 110 that is on photo mask 109. In this way, the lift-off process defines a recessed region 111.

Figure 10E:
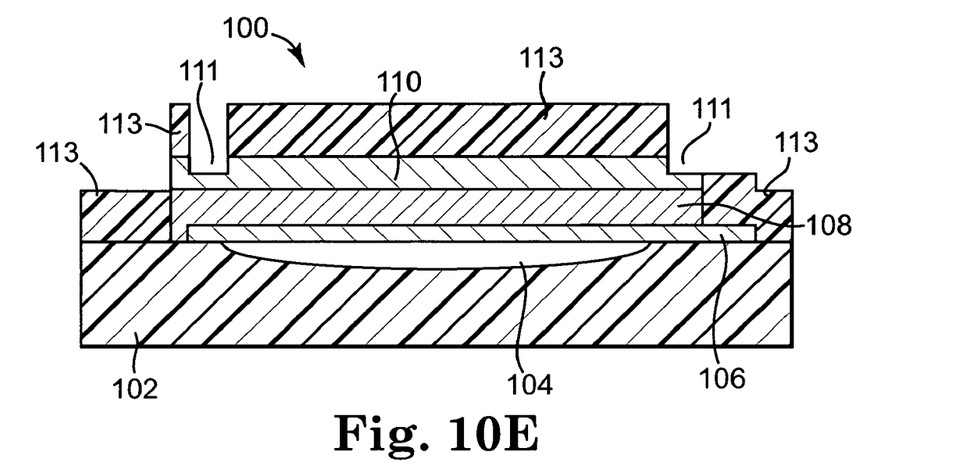
Figure 10F:
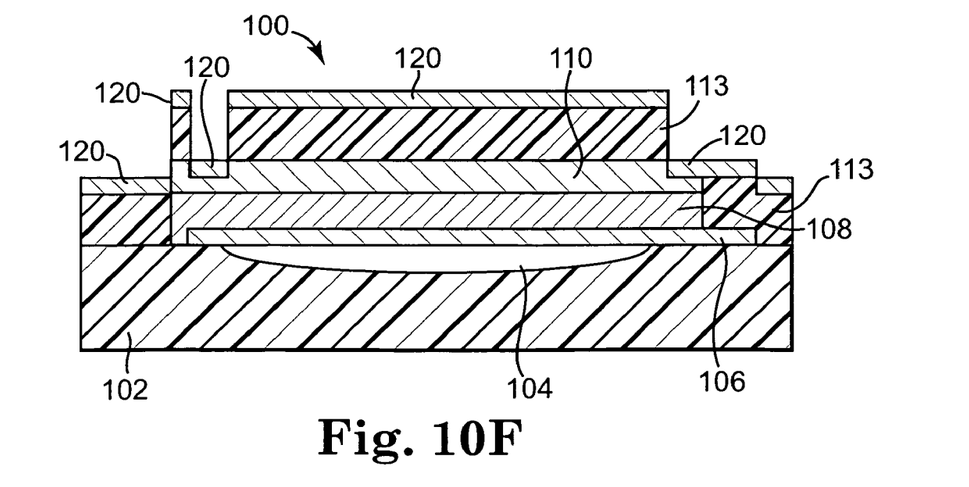

Next, FIG. 10E illustrates FBAR 100 with a photo mask 113 deposited over the FBAR membrane to pattern the fill. FIG. 10F illustrates FBAR 100 of FIG. 10E after fill material 120 deposition, but before the lift-off process. After the lift off process, FBAR 40 of FIG. 3 illustrates the resulting structure. In some embodiments, the FBAR may additionally utilize at least one passivation layer.

A filled recessed region on the bottom electrode may be constructed similarly. Furthermore, the top of the fill region does not necessarily need to align with the surface of the electrode, whether the fill region resides in the top electrode or bottom electrode. The recess in the FBAR can be generated by a lift-off process, but can also be made with an etch step. The fill material may be patterned in the recessed region by first masking with a photo mask, depositing metallization, and then using a lift-off to leave fill material in the recessed region. Fill material can also be added by first using a metal deposition, followed by a photo mask and an etch.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An acoustic resonator comprising:
   a substrate;
   a first electrode adjacent the substrate, wherein the first electrode has an outer perimeter;
   a piezoelectric layer adjacent the first electrode;
   a second electrode adjacent the piezoelectric layer, wherein the second electrode has an outer perimeter; and
   a fill region in one of the first and second electrodes, wherein the fill region in one of the first and second electrodes is adjacent the outer perimeter such that no portion of the fill region is more than 10s of microns from the outer perimeter.

2. The acoustic resonator of claim 1, wherein a depression is formed in the substrate and wherein the depression has a depression perimeter.

3. The acoustic resonator of claim 1, wherein an acoustic mirror is formed in the substrate and wherein the first electrode spans the acoustic mirror.

4. The acoustic resonator of claim 1 further including a passivation layer adjacent the second electrode, the passivation layer lying in a second plane that is generally parallel to a first plane.

5. The acoustic resonator of claim 1, wherein at least one of the first and second electrodes comprise a material that is a different material than a material in the fill region.

6. The acoustic resonator of claim 5, wherein the fill material is a material selected from the group comprising dielectrics, metals, metal alloys, piezoelectrics, Mo, Pt, Al, Cu, W, Au, Ag, polyimide, BCB, $SiO_2$, $Si_3N_4$, AlN, ZnO, $LiNbO_3$, PZT, $LiTaO_3$, and $Al_2O_3$.

7. The acoustic resonator of claim 1, wherein the fill region extends around a substantial portion of the outer perimeter of one of the first and second electrodes.

8. The acoustic resonator of claim 1 wherein the fill region is offset from the outer perimeter of one of the first and second electrodes by zero to 10s of microns.

9. An acoustic resonator comprising:
   a substrate;
   a first electrode adjacent the substrate, wherein the first electrode has an outer perimeter;
   a piezoelectric layer adjacent the first electrode;
   a second electrode adjacent the piezoelectric layer, wherein the second electrode has an outer perimeter; and
   a fill region in one of the first and second electrodes;
   wherein a depression is formed in the substrate;
   wherein the depression has a depression perimeter; and wherein the fill region in one of the first and second electrodes is outside the depression perimeter.

10. An acoustic resonator comprising:
a first electrode adjacent the substrate, wherein the first electrode has an outer perimeter;
a piezoelectric layer adjacent the first electrode;
a second electrode adjacent the piezoclectric layer, wherein the second electrode has an outer perimeter; and
a fill region in one of the first and second electrodes;
wherein a depression is formed in the substrate;
wherein the depression has a depression perimeter; and
wherein the fill region in one of the first and second electrodes overlaps the depression perimeter.

11. The acoustic resonator comprising:
a substrate;
a first electrode adjacent the substrate, wherein the first electrode has an outer perimeter;
a piezoelectric layer adjacent the first electrode;
a second electrode adjacent the piezoelectric layer, wherein the second electrode has an outer perimeter; and
a fill region in one of the first and second electrodes;
wherein a depression is formed in the substrate;
wherein the depression has a depression perimeter; and
wherein the fill region has a depth in one of the first and second electrodes that is on the order of hundreds to thousands of angstroms and a width on the order of fractions of a micron to tens of microns.

12. An acoustic resonator comprising:
a substrate having a first surface;
a first electrode adjacent the first surface of the substrate;
a layer of piezoelectric material adjacent the first electrode;
a second electrode adjacent the layer of piezoelectric material, the second electrode lying in a first plane; and
a fill region configured in the second electrode, wherein the fill material is denser than the electrode material such that it increases the acoustic impedance of the fill region relative to that at the center the acoustic resonator.

13. The acoustic resonator of claim 12, wherein a depression having a depression perimeter is formed in the first surface of the substrate and wherein the first electrode spans the depression.

14. The acoustic resonator of claim 13, wherein the fill region in the second electrode is outside the depression perimeter.

15. The acoustic resonator of claim 13, wherein the fill region in the second electrode is inside the depression perimeter.

16. The acoustic resonator of claim 13, wherein the fill region in the second electrode overlaps the depression perimeter.

17. The acoustic resonator of claim 12, wherein an acoustic mirror is formed in the first surface of the substrate and wherein the first electrode spans the acoustic mirror.

18. The acoustic resonator of claim 12, wherein the second electrode comprises a material that is a different material than that in die fill region.

19. An acoustic resonator comprising:
a substrate;
a first electrode adjacent the substrate;
a layer of piezoelectric material adjacent the first electrode;
a second electrode adjacent the layer of piezoelectric material, wherein the first electrode, the layer of piezoelectric material and the second electrode together form an acoustic membrane having an outer edge and a center; and
means for increasing the acoustic impedance of the outer edge of the acoustic membrane relative to that at the center the acoustic membrane, wherein the means for increasing the acoustic impedance comprises a material having a different dispersion characteristic than a material of the second electrode.

20. The acoustic resonator of claim 19, wherein the second electrode comprises a fill region having a material that is different than the material in the second electrode.

21. The acoustic resonator of claim 19 further comprising a fill material located exclusively at the outer edge of the acoustic membrane and not in the center of the acoustic membrane.

22. The acoustic resonator of claim 19, wherein the material is different than the material of the second electrode.

* * * * *

UNITED STATES PATENT AND TRADEMARK OFFICE
CERTIFICATE OF CORRECTION

| | |
|---|---|
| PATENT NO. | : 7,369,013 B2 |
| APPLICATION NO. | : 11/100311 |
| DATED | : May 6, 2008 |
| INVENTOR(S) | : Ronald S. Fazzio et al. |

It is certified that error appears in the above-identified patent and that said Letters Patent is hereby corrected as shown below:

On the Title Page, Item (56) (U.S. Patent Documents), Line 4, delete "Poirer et al." and insert -- Poirier et al. --;

Column 9, Line 3, (Approx.), Claim 10, below "comprising:" insert -- a substrate; --;

Column 9, Line 7, Claim 10, delete "piezoclectric" and insert -- piezoelectric --;

Column 9, Line 40, Claim 12, after "center" and before "the" insert -- of --;

Column 10, Line 15, (Approx.), Claim 18, delete "die" and insert -- the --.

Signed and Sealed this

Second Day of November, 2010

David J. Kappos
*Director of the United States Patent and Trademark Office*